(12) United States Patent
Bullied et al.

(10) Patent No.: US 10,633,760 B2
(45) Date of Patent: Apr. 28, 2020

(54) METHOD TO PREVENT GAP IN CYLINDRAL SEEDS AROUND AN INTERNAL CERAMIC CORE

(71) Applicant: United Technologies Corporation, Farmington, CT (US)

(72) Inventors: Steven J. Bullied, Pomfret Center, CT (US); Ryan C. Breneman, West Hartford, CT (US); Dilip M. Shah, Glastonbury, CT (US); Shiela R. Woodard, South Windsor, CT (US)

(73) Assignee: United Technologies Corporation, Farmington, CT (US)

( * ) Notice: Subject to any disclaimer, the term of this patent is extended or adjusted under 35 U.S.C. 154(b) by 204 days.

(21) Appl. No.: 15/946,090

(22) Filed: Apr. 5, 2018

(65) Prior Publication Data

US 2019/0309438 A1    Oct. 10, 2019

(51) Int. Cl.
| | |
|---|---|
| *B22C 9/24* | (2006.01) |
| *B22C 9/10* | (2006.01) |
| *C30B 11/14* | (2006.01) |
| *C30B 11/00* | (2006.01) |
| *C30B 29/52* | (2006.01) |
| *C30B 29/66* | (2006.01) |

(Continued)

(52) U.S. Cl.
CPC ............ *C30B 11/14* (2013.01); *B22C 9/02* (2013.01); *B22C 9/10* (2013.01); *B22C 9/24* (2013.01); *B22D 27/045* (2013.01); *C30B 11/002* (2013.01); *C30B 29/52* (2013.01); *C30B 29/66* (2013.01)

(58) Field of Classification Search
CPC .... B22C 9/02; B22C 9/10; B22C 9/24; B22D 27/045; B22D 7/04; B22D 19/0054; B22D 21/025; B22D 25/02
See application file for complete search history.

(56) References Cited

U.S. PATENT DOCUMENTS

| | | |
|---|---|---|
| 5,275,228 A | 1/1994 | Wortmann et al. |
| 6,969,240 B2 | 11/2005 | Strangman |

(Continued)

FOREIGN PATENT DOCUMENTS

EP    2952274 A1    12/2015

OTHER PUBLICATIONS

European Search Report dated Jul. 18, 2019 issued for corresponding European Patent Application No. 19167674.1.

*Primary Examiner* — Kevin P Kerns
*Assistant Examiner* — Steven S Ha
(74) *Attorney, Agent, or Firm* — Bachman & LaPointe, P.C.

(57) ABSTRACT

A process for casting a single crystal axis-symmetric thick walled tube comprising forming a axisymmetric single crystal ring seed around a circular internal core, wherein the ring seed has an inner diameter and a taper on the inner diameter, and wherein the internal core has an outer diameter and a matching taper on the outer diameter, the matching taper matching the taper of the inner diameter of the ring seed, and the internal core being free to translate in a vertical direction relative to the ring seed; and heating the ring seed so as to expand the ring seed relative to the internal core, and allowing the circular internal core to translate relative to the ring seed in a direction of the force of gravity, thereby maintaining contact between the circular internal core and the ring seed.

10 Claims, 3 Drawing Sheets

(51) Int. Cl.
*B22C 9/02* (2006.01)
*B22D 27/04* (2006.01)

(56) References Cited

U.S. PATENT DOCUMENTS 7,204,294 B2 4/2007 Jennings et al.
2004/0231822 A1 11/2004 Frasier et al.

METHOD TO PREVENT GAP IN CYLINDRAL SEEDS AROUND AN INTERNAL CERAMIC CORE

BACKGROUND

The present disclosure is directed to gas turbine engines. More particularly, the disclosure relates to manufacture of disks. The disclosure relates to a process to cast a single crystal.

In manufacture of nickel-based superalloy disks (e.g., for gas turbine engine turbine sections or high pressure compressor (HPC) sections), manufacture is by forging of powder metallurgical (PM) or cast forms.

In distinction, only casting techniques are typically used to form blades, vanes, and combustor panels. Many blades are manufactured by single crystal casting techniques. In an exemplary single crystal casting technique, a seed of single crystal material is used to define a crystalline orientation that propagates into the cast blade alloy as it cools and solidifies.

In casting blades, etc., removal of high angle grain boundaries (<10°) in single crystal nickel base superalloys leads to improved creep resistance and consequently enhances its temperature capability. In addition, by properly orienting the low modulus <100> direction along the direction in which high thermal strain exists, the thermal mechanical fatigue (TMF) capability of the material can also be significantly improved.

The ring seed of single crystal material is inserted into the ceramic mold at room temperature. The assembly is heated up to casting temperatures. A thermal expansion mismatch between the seed and ceramic mold causes a gap to form between the seed and the internal core. Subsequently when molten metal is poured into the mold, the molten metal will infiltrate the gap causing extraneous grains to form and producing defects into the casting.

SUMMARY

In accordance with the present disclosure, there is provided a process for casting a single crystal axis-symmetric thick walled tube comprises forming an axisymmetric single crystal ring seed around a circular internal core, wherein the ring seed has an inner diameter and a taper on the inner diameter, and wherein the internal core has an outer diameter and a matching taper on the outer diameter, the matching taper matching the taper of the inner diameter of the axisymmetric single crystal ring seed, and the internal core being free to translate in a vertical direction relative to the axisymmetric single crystal ring seed; and heating the axisymmetric single crystal ring seed so as to expand the axisymmetric single crystal ring seed relative to the internal core, and allowing the circular internal core to translate relative to the axisymmetric single crystal ring seed in a direction of the force of gravity, thereby maintaining contact between the circular internal core and the axisymmetric single crystal ring seed.

In another and alternative embodiment, the process further comprises preventing a gap from forming between the circular internal core and the axisymmetric single crystal ring seed during the heating step.

In another and alternative embodiment, the process further comprises preventing a molten metal from entering a gap between the circular internal core and the axisymmetric single crystal ring seed.

In another and alternative embodiment, the step of preventing a molten metal from entering a gap between the circular internal core and the axisymmetric single crystal ring seed, prevents spurious grain formation in the single crystal axis-symmetric thick walled tube.

In another and alternative embodiment, the process further comprises generating a cast crystal structure into a ring during a single crystal casting process utilizing the axisymmetric single crystal ring seed.

In another and alternative embodiment, the translation in the vertical direction is limited such that the internal core does not rest upon a chill plate base.

In accordance with the present disclosure, there is provided an axisymmetric investment casting mold assembly comprising an axisymmetric single crystal ring seed comprising a tapered wall having a tapered inner diameter; an internal core having an outer diameter having a matching taper with the tapered inner diameter of the axisymmetric single crystal ring seed; wherein the internal core outer diameter contacts the tapered inner diameter; the internal core and the axisymmetric single crystal ring seed configured to maintain contact responsive to thermal expansion of the axisymmetric single crystal ring seed during heat-up of the mold assembly.

In another and alternative embodiment, the axisymmetric single crystal ring seed is coupled to an axisymmetric investment casting mold and the internal core and the axisymmetric single crystal ring seed rests on top of a chill plate base.

In another and alternative embodiment, the taper can range from 2 degrees to 30 degrees relative to the top of the chill plate base.

In another and alternative embodiment, the coefficient of thermal expansion of the axisymmetric single crystal ring seed is different than the coefficient of thermal expansion of the internal core.

Other details of a process to cast a single crystal ring are set forth in the following detailed description and the accompanying drawings wherein like reference numerals depict like elements.

DETAILED DESCRIPTION

Figure 1:
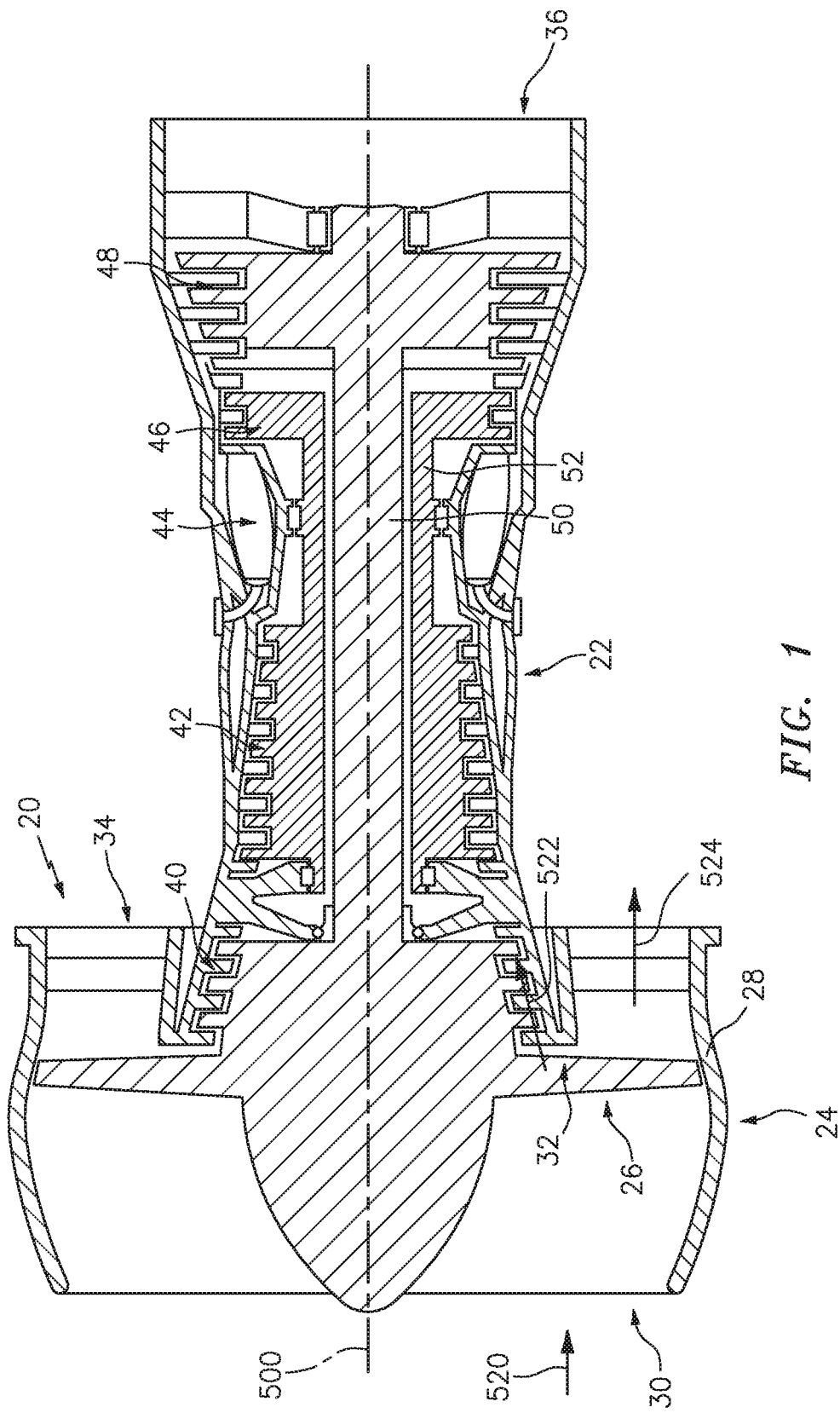
FIG. 1 is a schematic longitudinal sectional view of a turbofan engine.

FIG. 1 shows a gas turbine engine 20 having an engine case 22 surrounding a centerline or central longitudinal axis 500. An exemplary gas turbine engine is a turbofan engine having a fan section 24 including a fan 26 within a fan case 28. The exemplary engine includes an inlet 30 at an upstream end of the fan case receiving an inlet flow along an inlet flow path 520. The fan 26 has one or more stages of fan blades 32. Downstream of the fan blades, the flow path 520 splits into an inboard portion 522 being a core flow path and passing through a core of the engine and an outboard portion 524 being a bypass flow path exiting an outlet 34 of the fan case.

The core flow path 522 proceeds downstream to an engine outlet 36 through one or more compressor sections, a combustor, and one or more turbine sections. The exemplary engine has two axial compressor sections and two axial turbine sections, although other configurations are equally applicable. From upstream to downstream there is a low pressure compressor section (LPC) 40, a high pressure compressor section (HPC) 42, a combustor section 44, a high pressure turbine section (HPT) 46, and a low pressure turbine section (LPT) 48. Each of the LPC, HPC, HPT, and LPT comprises one or more stages of blades which may be interspersed with one or more stages of stator vanes.

In the exemplary engine, the blade stages of the LPC and LPT are part of a low pressure spool mounted for rotation about the axis 500. The exemplary low pressure spool includes a shaft (low pressure shaft) 50 which couples the blade stages of the LPT to those of the LPC and allows the LPT to drive rotation of the LPC. In the exemplary engine, the shaft 50 also directly drives the fan. In alternative implementations, the fan may be driven via a transmission (e.g., a fan gear drive system such as an epicyclical transmission) to allow the fan to rotate at a lower speed than the low pressure shaft.

The exemplary engine further includes a high pressure shaft 52 mounted for rotation about the axis 500 and coupling the blade stages of the HPT to those of the HPC to allow the HPT to drive rotation of the HPC. In the combustor 44, fuel is introduced to compressed air from the HPC and combusted to produce a high pressure gas which, in turn, is expanded in the turbine sections to extract energy and drive rotation of the respective turbine sections and their associated compressor sections (to provide the compressed air to the combustor) and fan.

Figure 2:
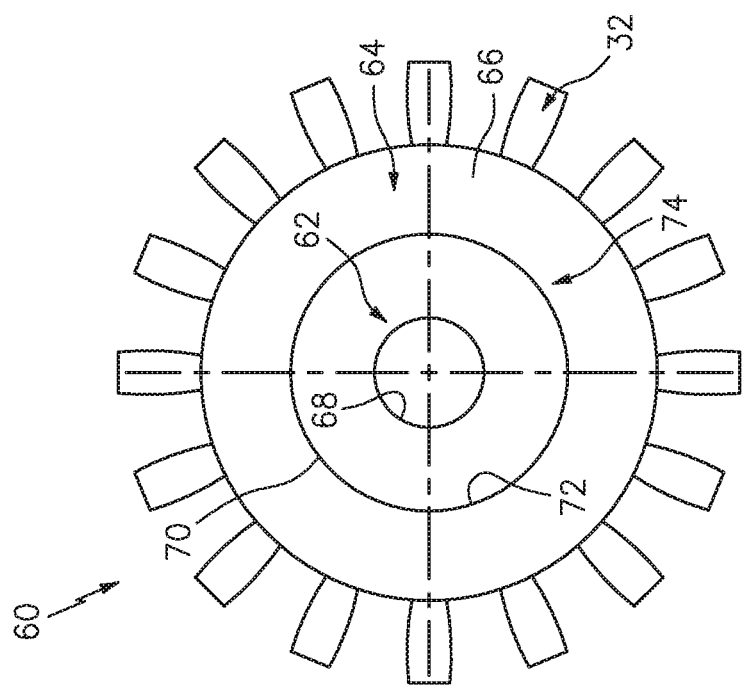
FIG. 2 is an end view of an integrally bladed rotor.

FIG. 2 shows a disk 60 formed with a bore 62 bonded to an integrally bladed rim or simply rim 64. The rim 64 includes a ring portion 66 and a circumferential array of blades 32 extending from an outer diameter (OD) surface of the ring 66 to free tips. The exemplary blades 32 are airfoils extending from a leading edge to a trailing edge and having a pressure side and a suction side between such edges. The bore 62 has an inner diameter (ID) surface 68 and an outer diameter (OD) surface 70. The ring 66 has an ID surface 72 mated to the OD surface 70 and bonded thereto by a bond 74 (e.g., via friction welding or other bonding process).

Figure 3:
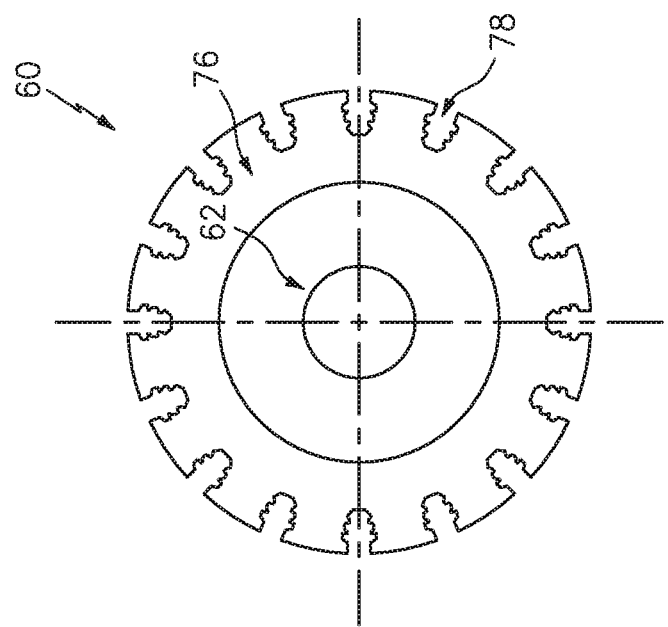
FIG. 3 is an end view of a rotor disk.

FIG. 3 shows an otherwise similar disk 60 but where a ring 76 replaces the ring 66 and has a circumferential array of blade retention slots 78 in its OD surface. The slots 78 receive the fir tree roots of blades (not shown) which may be separately formed and may be conventional cast single crystal blades. Generally the intent of bonding rim or bladed rim to bore is to achieve optimum high temperature performance of blades and rim while maintaining low temperature tensile strength of the bore 62.

Figure 4:
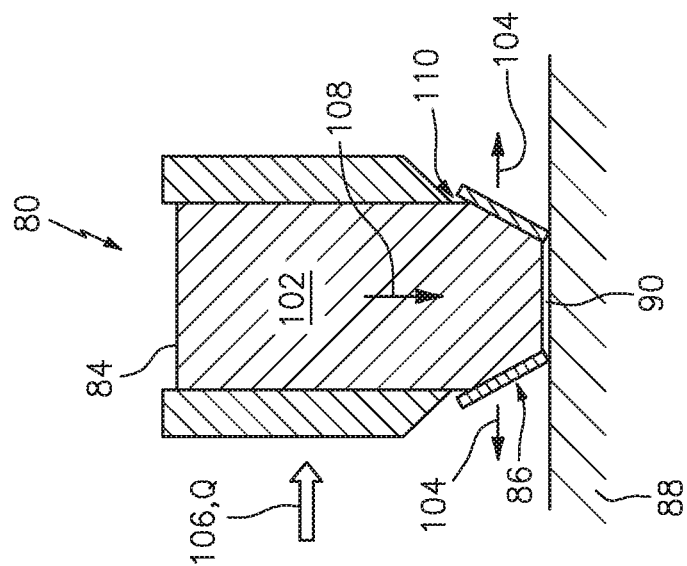
FIG. 4 is a cross-sectional illustration of an exemplary mold assembly prior to heat-up in accordance with various embodiment.
Figure 5:
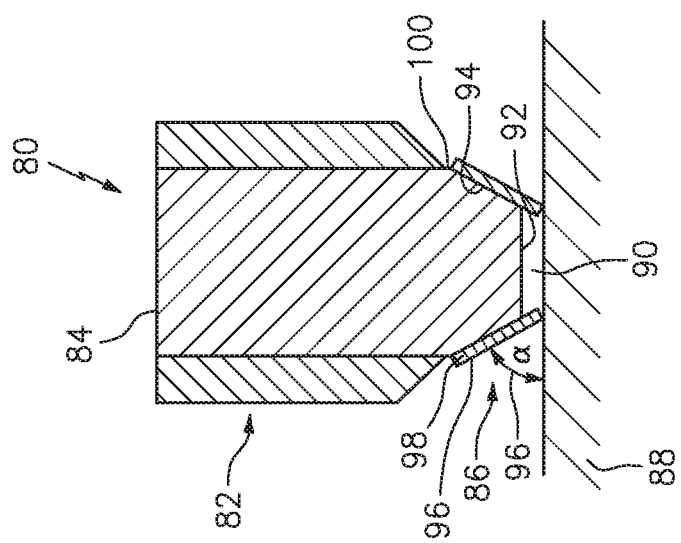
FIG. 5 is a cross-sectional illustration of an exemplary mold assembly after heat-up in accordance with various embodiments.

Referring also to FIGS. 4 and 5, an exemplary mold assembly 80 is shown. The mold assembly 80 includes an axisymmetric investment casting mold 82 surrounding a cylindrical ceramic core or circular internal core 84, also known as a central post 84. A circular single crystal ring seed, axisymmetric seed or simply seed 86 is coupled to the axisymmetric investment casting mold 82 and the circular internal core 84. The axisymmetric seed 86 rests on top of a chill plate base 88. A gap 90 is located between a core lower portion 92 within the interior of the axisymmetric seed 86. In an exemplary embodiment, the gap 90 can range in size from about 20 to about 50 thousandths of an inch.

The axisymmetric seed 86 is configured as a cylinder shape having angled or tapered wall 98, similar to a frustoconical shape with the larger diameter facing the central post 84 above and the smaller diameter proximate the chill plate base 88. The axisymmetric seed 86 includes an inner diameter 94 and a taper 96 the inner diameter of the tapered wall 98 are uniquely different than the traditional seed, in that the traditional seed has a right circular cylinder shape with no taper in the outer walls. In an exemplary embodiment the inner diameter 94 of the axisymmetric seed 86 can vary and range from a smaller diameter of about 4.5 inches to about 20 inches and have a wall thickness of about ⅛ inch.

The angle/taper 96 between the tapered wall 98 and the chill plate 88 can range from about 2 degrees to about 30 degrees. The tapered wall 98 of the axisymmetric seed 86 is configured to match the internal core 84 outer diameter 100 that is proximate to each other. The internal core 84 outer diameter 100 and the tapered wall 98 of the axisymmetric seed 86 can have a matching taper 96. The matching taper/angle 96 maintains constant contact between the axisymmetric seed 86 and the internal core 84.

The configuration of the axisymmetric seed 86 and internal core 84 allows for the axisymmetric seed 86 to thermally expand and thus allow for the internal core 84 to be free to translate in a vertical direction relative to the axisymmetric seed 86.

The axisymmetric seed 86 expands responsive to the thermal energy added at the mold heat up step during the casting process. The axisymmetric seed 86 expands at the casting temperature. This expansion is illustrated by arrows 104. The thermal energy Q heating the mold 82 is illustrated by arrow 106.

As seen in FIG. 5, the internal core 84 is shown as having translated vertically. The translation is relative to the axisymmetric seed 86 in a direction of the force of gravity (shown by arrow 108). The gap 90 has decreased in size. In an exemplary embodiment, the vertical movement of the internal core 84 can be about 60 thousandths for an axisymmetric seed 86 with tapered wall 98 at about a 45 degree angle/taper 96. The gap 90 can be sufficiently large, such that the internal core 84 does not rest upon the base 88.

The process to cast the single crystal thick walled tube 102 which would subsequently be cut into rings, 66, 76 and then bonded to the outside diameter (OD) of a forged disk 62.

The exemplary process of creating axisymmetric rings from an axisymmetric single crystal ring seed 86 is formed around the circular internal ceramic core 84 (which will subsequently form the inner diameter (ID) of the ring).

These single crystal rings are unique and novel in that they have a primary crystal orientation parallel to the engine center line and a secondary orientation that varies around the ring so that it is constantly normal to ring surface (in-line with blade pull direction).

In the exemplary process the axisymmetric seed 86 is used to generate the cast crystal structure into the ring during the single crystal casting process. The axisymmetric seed 86 is inserted into the ceramic mold assembly 80 at room temperature and then the assembly 80 is heated up to casting temperatures, during this step a thermal expansion mismatch causes a gap 110 (only shown at FIG. 5 for explanatory purposes) to form between the axisymmetric seed 86 and the internal core 84.

The exemplary method to eliminate this gap from forming during the mold heat up process, includes forming the taper 96 on the inner diameter 94 of the axisymmetric seed 86 with the larger end toward the top of the mold 82 and then matching the taper on the outer diameter 100 of the internal core 84 and additionally allowing the internal core 84 freedom to travel in the vertical direction. As such as the axisymmetric seed 86 is heated up and expands the internal core 84 would have freedom to translate down due to gravity and the matching tapers 96 would remain in contact not allowing the gap 110 to form between the axisymmetric seed 86 and internal core 84.

There has been provided a process to cast a single crystal. While a process to cast a single crystal has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. A process for casting a single crystal axis-symmetric thick walled tube comprising:
    forming an axisymmetric single crystal ring seed around a circular internal core, wherein the ring seed has an inner diameter and a taper on the inner diameter, and wherein the internal core has an outer diameter and a matching taper on the outer diameter, said matching taper matching the taper of the inner diameter of the axisymmetric single crystal ring seed, and said internal core being free to translate in a vertical direction relative to the axisymmetric single crystal ring seed; and
    heating said axisymmetric single crystal ring seed so as to expand said axisymmetric single crystal ring seed relative to said internal core, and allowing said circular internal core to translate relative to said axisymmetric single crystal ring seed in a direction of the force of gravity, thereby maintaining contact between said circular internal core and said axisymmetric single crystal ring seed.

2. The process of claim 1, further comprising:
    preventing a gap from forming between said circular internal core and said axisymmetric single crystal ring seed during said heating step.

3. The process of claim 1, further comprising:
    preventing a molten metal from entering a gap between said circular internal core and said axisymmetric single crystal ring seed.

4. The process of claim 3, wherein said step of preventing a molten metal from entering the gap between said circular internal core and said axisymmetric single crystal ring seed, prevents spurious grain formation in said single crystal axis-symmetric thick walled tube.

5. The process of claim 1, further comprising:
    generating a cast crystal structure into a ring during a single crystal casting process utilizing said axisymmetric single crystal ring seed.

6. The process of claim 1, further comprising:
    limiting said translation in the vertical direction such that said internal core does not rest upon a chill plate base.

7. An axisymmetric investment casting mold assembly comprising:
    an axisymmetric single crystal ring seed comprising a tapered wall having a tapered inner diameter;
    an internal core having an outer diameter having a matching taper with said tapered inner diameter of said axisymmetric single crystal ring seed; wherein said internal core outer diameter contacts said tapered inner diameter;
    said internal core and said axisymmetric single crystal ring seed configured to maintain contact responsive to thermal expansion of said axisymmetric single crystal ring seed during heat-up of said mold assembly.

8. The axisymmetric investment casting mold assembly according to claim 7, wherein said axisymmetric single crystal ring seed is coupled to an axisymmetric investment casting mold and the internal core and said axisymmetric single crystal ring seed rests on top of a chill plate base.

9. The axisymmetric investment casting mold assembly according to claim 8, wherein said taper can range from 2 degrees to 30 degrees relative to said top of said chill plate base.

10. The axisymmetric investment casting mold assembly according to claim 7, wherein the coefficient of thermal expansion of said axisymmetric single crystal ring seed is different than the coefficient of thermal expansion of said internal core.

* * * * *